United States Patent [19]
Schrader

[11] Patent Number: 5,880,636
[45] Date of Patent: Mar. 9, 1999

[54] INPUT STAGE FOR OPERATIONAL AMPLIFIER UTILIZING PHASE DELAY OF ACTIVE LOAD CURRENT MIRROR TO ACHIEVE IMPROVED BANDWIDTH AND PHASE MARGIN

[75] Inventor: Victor P. Schrader, Oakland, Calif.

[73] Assignee: National Semiconductor Corporation, Santa Clara, Calif.

[21] Appl. No.: 662,051

[22] Filed: Jun. 12, 1996

Related U.S. Application Data

[60] Provisional application No. 60/013,179 Mar. 12, 1996.
[51] Int. Cl.$^6$ .................................................. H03F 3/45
[52] U.S. Cl. .......................................... 330/252; 330/257
[58] Field of Search .............................. 330/69, 252, 257, 330/288, 302

[56] References Cited

U.S. PATENT DOCUMENTS 5,182,526  1/1993  Nelson .................................... 330/257

*Primary Examiner*—Steven Mottola
*Attorney, Agent, or Firm*—Limbach & Limbach L.L.P.

[57] ABSTRACT

In a technique for reducing the transconductance of an input stage of an operational amplifier, the phase delay which the active load current mirror introduces into the single path is utilized in a way such that the phase delay of the overall stage is less than the delay of the primary differential pair. It is a mathematical fact that when two sinusoidal signals of the same frequency are added together, the result is also sinusoidal. Considering two such signals, the second of which has a phase lag with respect to the first, if the two signals are combined by the addition of ordinates, the resulting sinusoid also has a phase lag. However, if the second signal is instead subtracted from the first, then the resulting sinusoid has a phase lead with resect to the first signal. The present invention makes use of this phenomenon by causing the delayed mirror signal to be subtracted from, rather than added to, the primary signal. This produces a differential transconductance stage with less negative phase shift than that of the prior art, in fact less than that of the primary differential pair alone.

2 Claims, 12 Drawing Sheets

INPUT STAGE FOR OPERATIONAL AMPLIFIER UTILIZING PHASE DELAY OF ACTIVE LOAD CURRENT MIRROR TO ACHIEVE IMPROVED BANDWIDTH AND PHASE MARGIN

RELATED APPLICATION

This is a Continuation-In-Part of U.S. Provisional application Ser. No. 60/013,179, filed Mar. 12, 1996.

BACKGROUND OF THE INVENTION

1. Field of the Invention

The present invention relates generally to operational amplifiers and, in particular, to a simple, effective technique for reducing the transconductance of the differential stage of an operational amplifier to increase bandwidth and/or phase margin.

2. Discussion of the Related Art

R. J. Widlar and Mineo Yamatake, "A Monolithic Power Op Amp", IEEE Journal of Solid State Circuits, Vol. 23, no. 2, pp. 527–535, April 1988, disclose a power amplifier integrated circuit (IC) wherein the lateral pnp transistors in the differential stage have their collectors split into two equal segments. The current mirror is fed from one collector on each transistor, making its operating current independent of the input voltage. This takes the phase shift of the current mirror out of the signal path.

By way of explanation, the current mirror's current is in fact a DC current; the signal incurs no delay in the current mirror for the precise reason that no signal is applied to the mirror. As a result, the total transconductance of the stage is decreased. As a further result, the total phase shift of the transconductance stage consists only of the delay introduced by the primary differential pnp pair, thereby improving the phase margin.

SUMMARY OF THE INVENTION

In accordance with the present invention, the pnp transistors of the differential stage of an operational amplifier have their collectors split in an asymmetric fashion, with the area of the cross-coupled collector being larger than the area of the primary collector. This causes the current mirror to be modulated with a signal of opposite sense to that which is usual.

More specifically, it is a mathematical fact that when two sinusoidal signals of the same frequency are added together, the result is also sinusoidal. Consider two such sinusoidal signals, A and B, where magnitudes |A|>0 and |B|>0. Let B have a delay $t_{DB}$ with respect to A such that $t_{DB}<0.5\ T_A$, where $T_A$ is the period of A. If B is added to A, then the sum C also has a delay with respect to A. But if B is instead subtracted from A, then the difference D has a negative delay with respect to A; that is, D appears to anticipate A so that a phase lead is created.

The present invention makes use of this phenomenon by causing the delayed output of the current mirror to be subtracted from the output of the primary differential pnp pair, rather than added to it in the usual manner. This produces a differential transconductance stage with less delay than that of the primary pnp pair alone.

The Widlar/Yamatake circuit removes the delay of the current mirror by taking the mirror out of the signal path. In contradistinction to this, the present invention puts the current mirror in the signal path, and, in addition, utilizes its delay to further decrease or eliminate entirely the total delay of the transconductance stage.

Other features and advantages of the present invention will become apparent and be appreciated by reference to the following detailed description which should be considered in conjunction with the accompanying drawings.

DETAILED DESCRIPTION OF THE INVENTION

Figure 1:
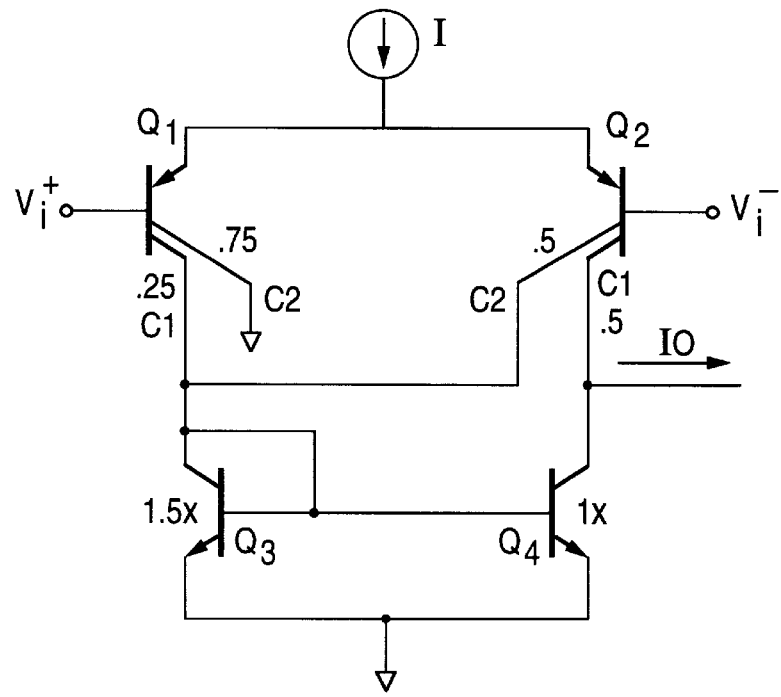
FIG. 1 is a schematic diagram illustrating an embodiment of an input stage in accordance with the present invention.

FIG. 1 shows the differential stage of an operational amplifier in accordance with the present invention. As shown in the FIG. 1 schematic, the differential pnp transistors Q1 and Q2 have their collectors split in an asymmetric fashion, with the area of the cross-coupled collector larger than the area of the primary collector. Specifically, for pnp transistor Q2, the C2 area ratio is 0.5, while for pnp transistor Q1, the C1 area ratio is 0.25. This causes the mirror to be modulated with a signal of opposite sense to that which is usual, such that as the collector current of transistor Q2 increases, the collector current of transistor Q4 also increases.

It can be shown that for C, D, E, $\omega$, $\phi_1$, and $\phi_2 \in \{R\}$ $$C\cos\omega t + D\cos(\omega t + \phi_1) = E\cos(\omega t + \phi_2), \quad (1a)$$

where $$E=(C^2+2\ CD\cos\phi_1+D^2)^{1/2} \quad (1b)$$

and $$\phi_2=\tan^{-1}[\sin\phi_1/(\cos\phi_1+C/D)]. \quad (1c)$$

Equation (1) describes the behavior of the (prior art) conventional differential pair with active load, the (prior art) Widlar/Yamatake circuit, and the present invention; the three types of circuits operate in three mutually exclusive regions which can be specified using the independent coefficients C and D, as will be shown. When the conditions are specified, the output phase $\phi_2$ also takes on mutually exclusive values for each of the three types of circuits.

A pnp differential stage with an npn active load current mirror configured in a number of ways will be used for the purpose of illustrating the differences between the three described circuit types. However, one skilled in the art will understand that these are not the only possible realizations of the novel ideas presented, and many variations will be apparent which do not depart from the spirit of these ideas. Also, the phrases "primary pnp output collector", "primary pnp output" and "primary pnp collector" are used interchangeably to refer to the pnp collector which is attached to the output node.

Referring to equation (1) and each of the three described circuit types:

(a) The time-varying (small signal) component of the current output of the primary pnp collector is represented with the term $C\cos\omega t$. It should be noted that reference phase $\phi_0$ is the phase of this output, not the phase of the input. Reference phase $\phi_0$ is not explicit in equation (1) because it is here defined to be always equal to zero, which can be done without a loss of generality. Explicit inclusion of reference phase $\phi_0$ in (1a) would lead to the equation $C\cos(\omega t+\phi_0)+D\cos(\omega t+\phi_0+\phi_1)=E\cos(\omega t+\phi_0+\phi_2)$. Generally, if the input phase were used as a reference (i.e., set equal to zero), reference phase $\phi_0$, (as presently defined) would be real and negative for all real devices. It is hereinafter defined to be zero and omitted for simplicity.

(b) The time-varying component of the current output of the active load current mirror is represented with the term $D\cos(\omega t+\phi_1)$ where phase term $\phi_1$ represents the additional phase shift introduced by the mirror. Phase term $\phi_1$ is real and negative for all real current mirror circuits. Of greatest interest is the region $-\pi<\phi_1<0$, since for all output phase angles less than or equal to $-\pi$, the open-loop gain of an op amp must be less than unity to assure a stable output for closed-loop gain $A_v=+1$.

(c) The time-varying component of the current output of the transconductance stage, i.e., the combined output of the primary pnp collector (a) and of the active load current mirror (b) is represented with the term $E\cos(\omega t+\phi_2)$. Thus, E represents the magnitude of the combined output, and phase term $\phi_2$ represents the phase angle (relative to the primary pnp output current) of the combined output.

Figure 2:
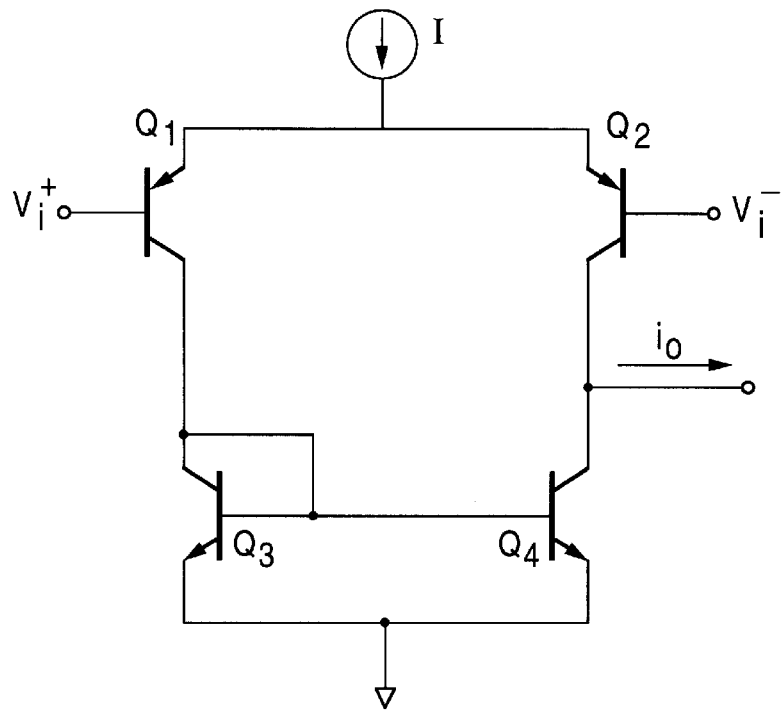
FIG. 2 is a schematic diagram illustrating a conventional Class I transconductance stage.

For the purposes of this discussion, differential active-load transconductance stages are now explicitly divided into three classes, as follows:

Class I topologies are defined as those in which, neglecting circuit delays, the small-signal magnitude of the output is greater than the small-signal magnitude of the primary pnp collector output, as in FIG. 2, where $|i^o|>|i^{c2}|$.

Figure 3:
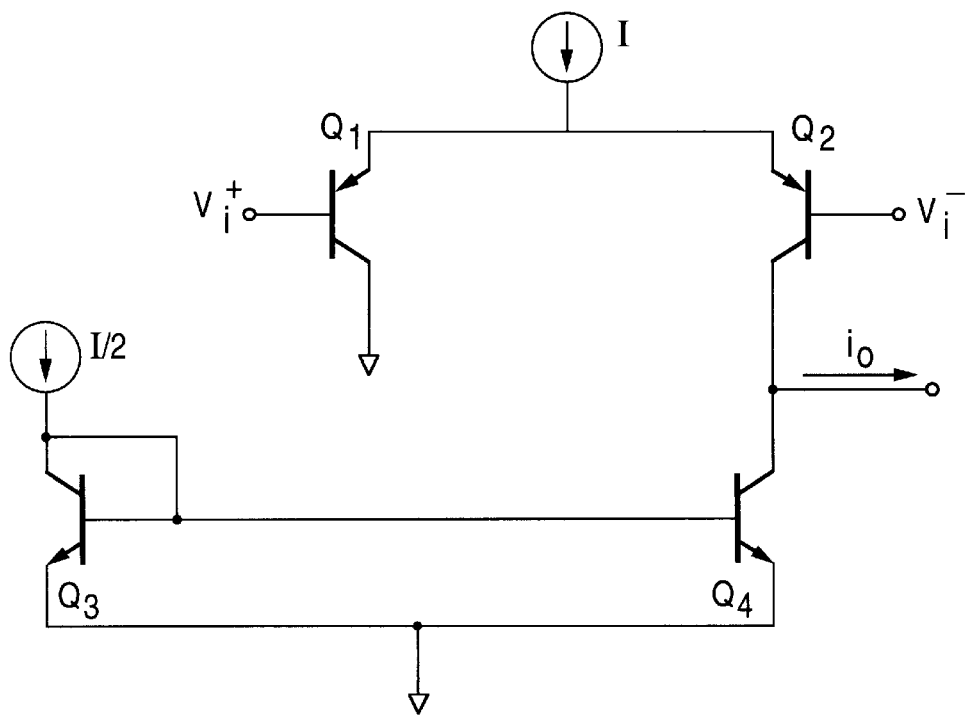
FIG. 3 is a schematic diagram illustrating a conventional Class II transconductance stage.

Class II topologies are defined as those in which, neglecting circuit delays, the small-signal magnitude of the output is equal to the small-signal magnitude of the primary pnp collector output; i.e., the current mirror small-signal output is zero. The Widlar/Yamatake circuit is in this class. Another (prior art) example is shown in FIG. 3.

Class III topologies are defined as those in which, neglecting circuit delays, the small-signal magnitude of the output is less than the small-signal magnitude of the primary pnp collector output. Referring to FIG. 1, $|i_o|<|i_{c2}|$. The present invention falls into this class.

Figure 4A:
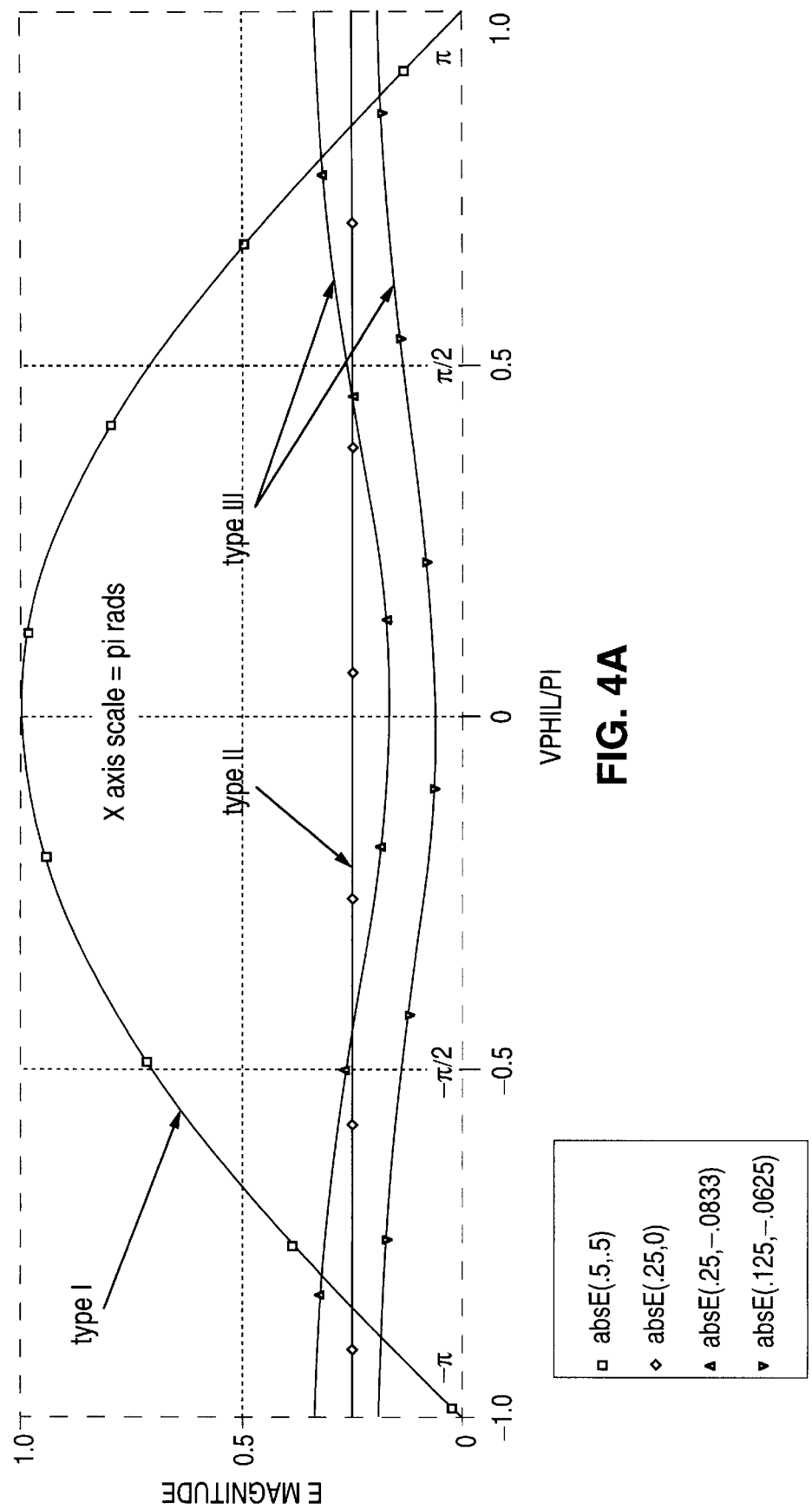
FIGS. 4A and 4B are, respectively, magnitude and phase plots showing the behavior of output magnitude and phase for classes I, II, and III transconductance stages.

FIGS. 4A/5A and 4B/5B are magnitude and phase plots, respectively, of eq. (1), showing the behavior of output magnitude E and phase $\phi_2$ for classes I, II, and III transconductance stages, over the domain $-\pi<\phi_1<\pi$. AbsE(C,D) and phi2(C,D) are the output magnitude and phase, respectively, which are plotted as functions of $\phi_1$ for a number of values of C and D. Note that I, the supply current for each of the circuits, is normalized to 1 so that the plotted magnitudes are proportional to output transconductances and may, therefore, be meaningfully compared.

Figure 4B:
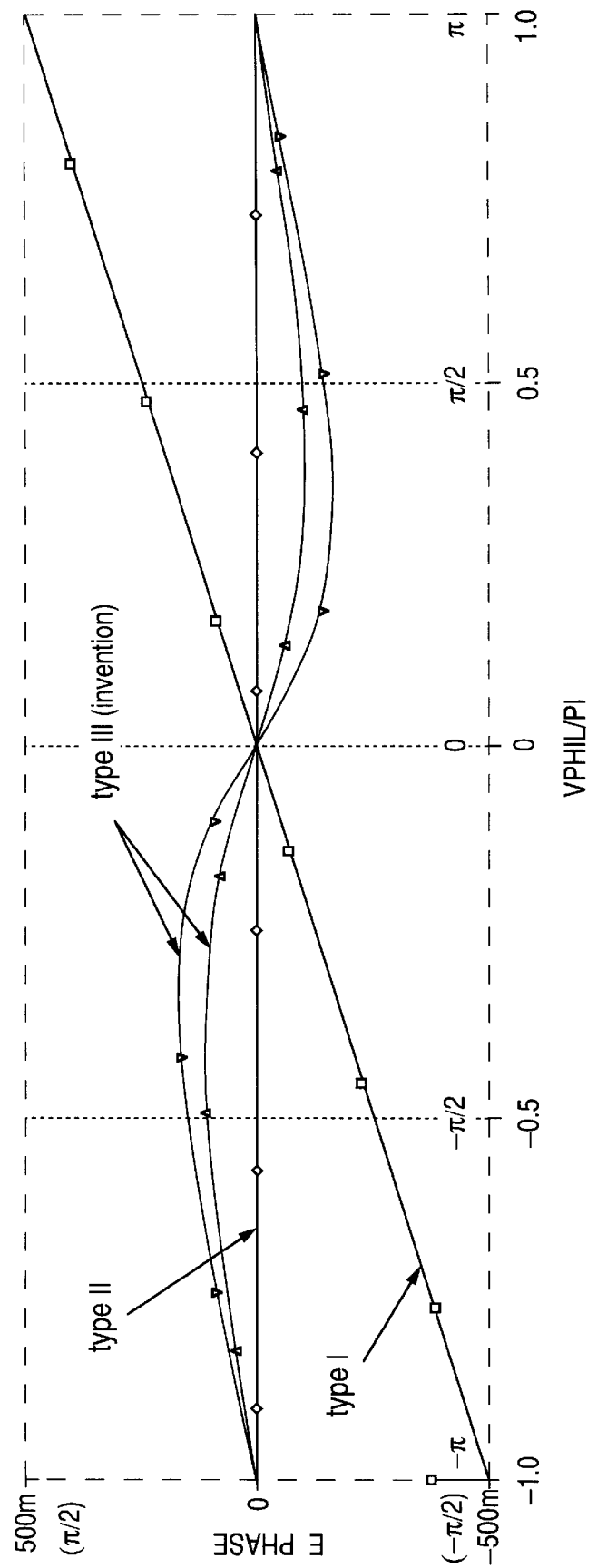

FIGS. 4A and 4B show, respectively, the output magnitude E and phase $\phi_2$ of class I, II and III stages. In particular, the response of the class I stage of FIG. 2, for which C=D=0.5, is shown; the relevant traces are labeled absE(0.5, 0.5) and phi2(0.5,0.5), respectively. Note that the phase function, phi2(0.5,0.5), is negative for every negative value of phase term $\phi_1$. Recalling that the reference phase $\phi_0$ of the primary pnp collector output is by definition zero, it can be seen that the output pease $\phi_2$ for this type of stage is everywhere more negative than the phase of the primary pnp output, that is, $\phi_2<\phi_0$.

Next consider the class II stage, for which C=0.25 and D=0; referring to FIGS. 4A and 4B, traces absE(0.25,0) and phi2(0.25,0) show the output magnitude and phase, respectively. For this type of stage, the output phase $\phi_2$ is a constant function of the current mirror phase shift $\phi_1$; this is what is meant by taking "the phase shift of the mirror out of the signal path". The total phase shift $\phi_2$ of the stage is everywhere equal to the reference phase $\phi_0$ of the primary pnp output, that is, $\phi_2=\phi_0$.

Now consider several class III stages, for which $-C<D<0$. Referring to the generalized circuit of FIG. 2, $C=(I/2)(1/(A+1))$ and $D=(I/2)(1/(B+1)-A/(A+1))(1/K)$. The specific circuits the behavior of which is shown in FIG. 5 are those of FIG. 1 for which A=1, B=3; K=1.5, and FIG. 6, for which A=3, B=3, and K=4; and FIG. 7, for which A=3, B=1 and K=5. It can be seen that for $-\pi<\phi_1<0$, the value of output phase $\phi_2$ is everywhere greater than zero. The output phase $\phi_2$ is positive (phase lead) with respect to the reference phase $\phi_0$ of the primary pnp output, that is, $\phi_2>\phi_0$.

In practical circuit-design terms, this means that the total output phase of a class III transconductance stage (of which the invention is the sole example) is less negative at any frequency than a class I or a class II stage, but most notably at frequencies close to the amplifier's unity-gain frequency. Compared to class I or II designs, the designer may therefore allow a greater gain-bandwidth product in a class III design. It is possible to use a smaller compensation capacitor in the transconductance stage to achieve both greater bandwidth and greater phase margin, thus effecting improved performance and reduced die area relation to a class I or II design.

Figure 5A:
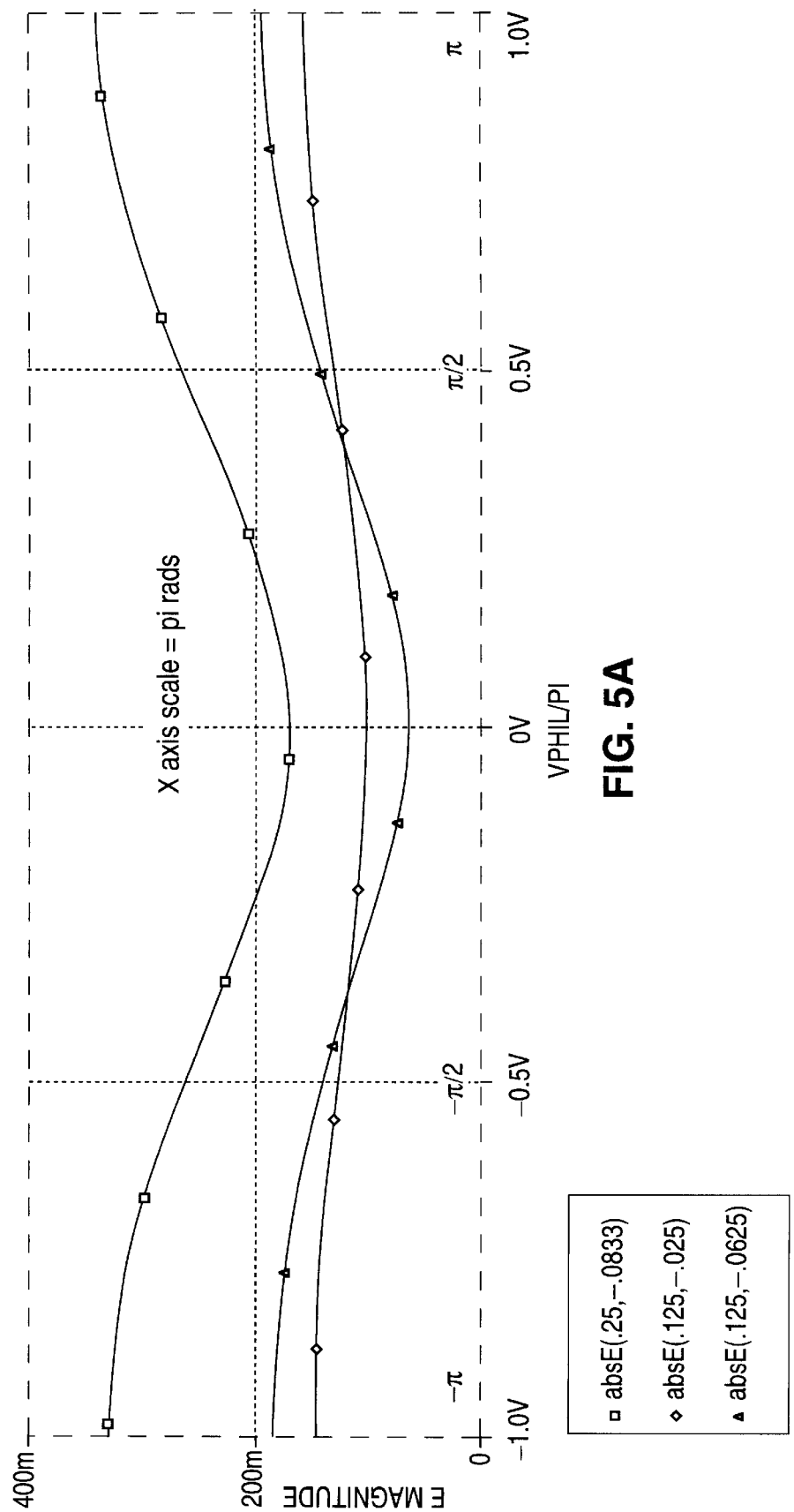
FIGS. 5A and 5B are, respectively, magnitude and phase plots of the output magnitude and phase of three performed embodiments of the present invention.
Figure 5B:
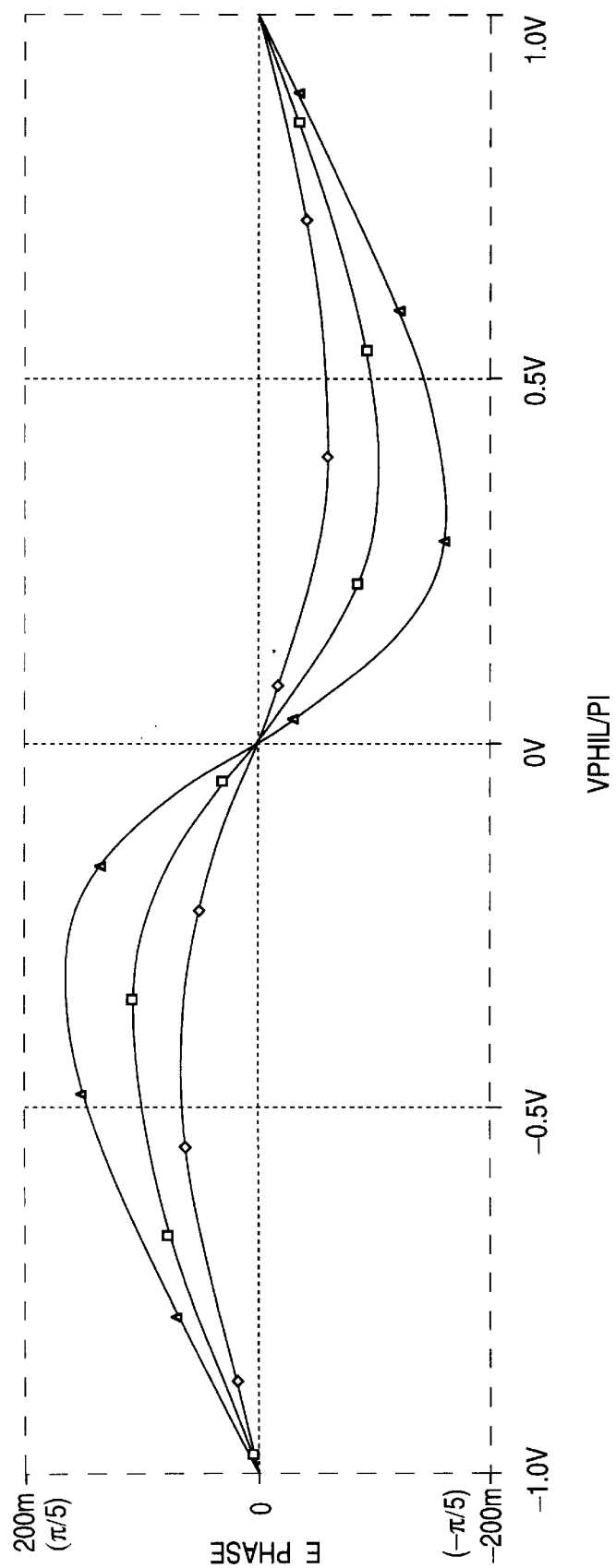
Figure 6:
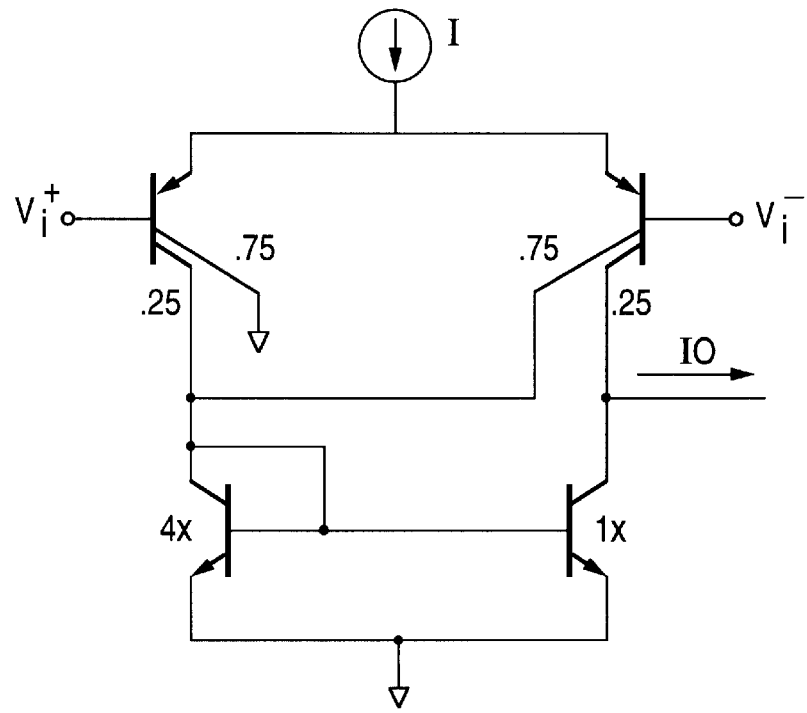
FIGS. 6 and 7 are schematic diagrams illustrating additional alternative embodiments of an input stage in accordance with the invention.
Figure 7:
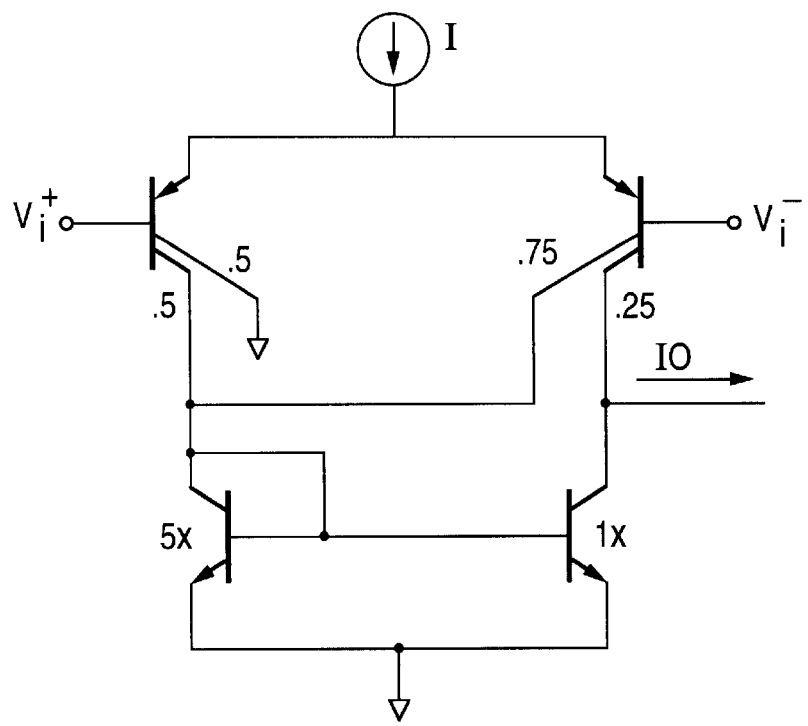

FIGS. 5A and 5B show, respectively, the output magnitude E (FIG. 5A) and output phase φ₂ of three preferred embodiments of the invention, the circuits of FIGS. 1, 6 and 7, with vertical scales expanded for clarity.

As stated above in the summary of the invention, the present invention makes use of this phenomenon by causing a delayed mirror signal to be subtracted from, rather than added to, the primary signal. Referring again to FIG. 1, this produces a transconductance stage with less negative phase shift than that of the primary differential pnp pair Q1/Q2 alone.

Figure 8:
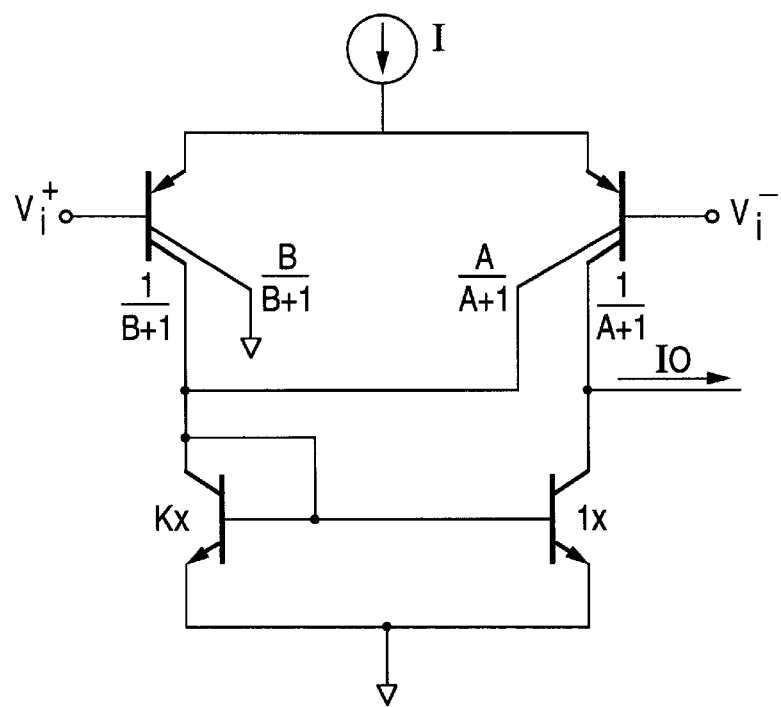
FIG. 8 is a schematic diagram illustrating a general embodiment of an input stage in accordance with the present invention.

FIG. 8 shows a generalized version of a differential stage which is in accordance with the invention whenever the following two conditions are met:

Condition 1: $AB > 1$

Figure 9:
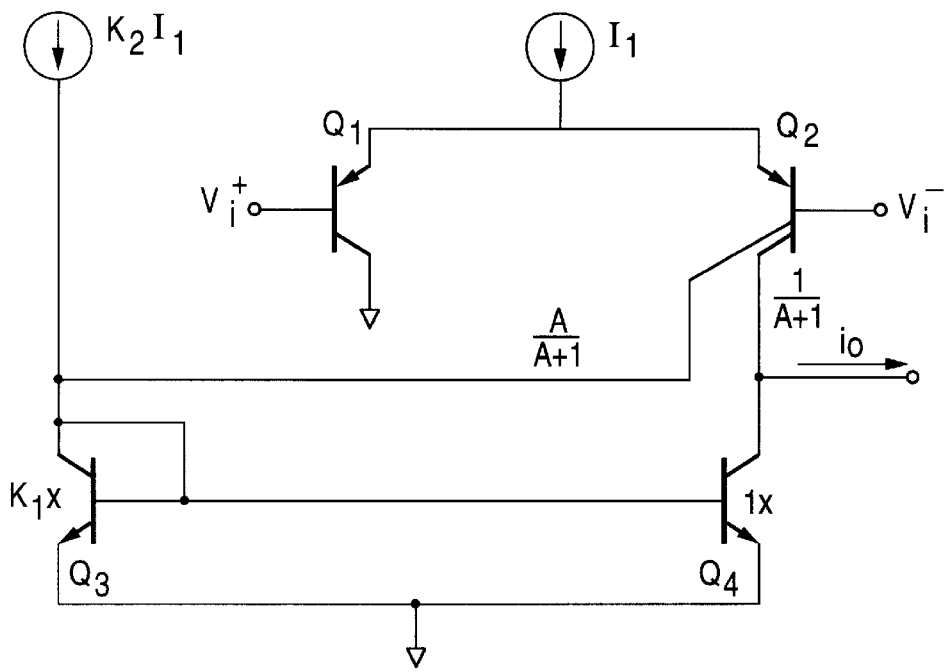
FIG. 9 is a schematic diagram illustrating a generalized alternative embodiment of the present invention.

Condition 2: $\frac{1}{A+1} > \frac{1}{K}\left(\frac{A}{A+1} - \frac{1}{B+1}\right)$ where $K = A + \frac{A+1}{B+1}$ FIG. 9 shows a generalized alternative embodiment of the invention when the following conditions are met:
Condition 1:
A>0
Condition 2:
A<K₁
where $K_1 = A + 2K^2(A+1)$ Condition 1 specify a transconductance stage in which the current mirror is driven in the sense opposite to that which is usual, while conditions 2 guarantee that the transconductance stage output has the usual polarity, i.e., such that the base of Q2 is the inverting input.

Figure 10:
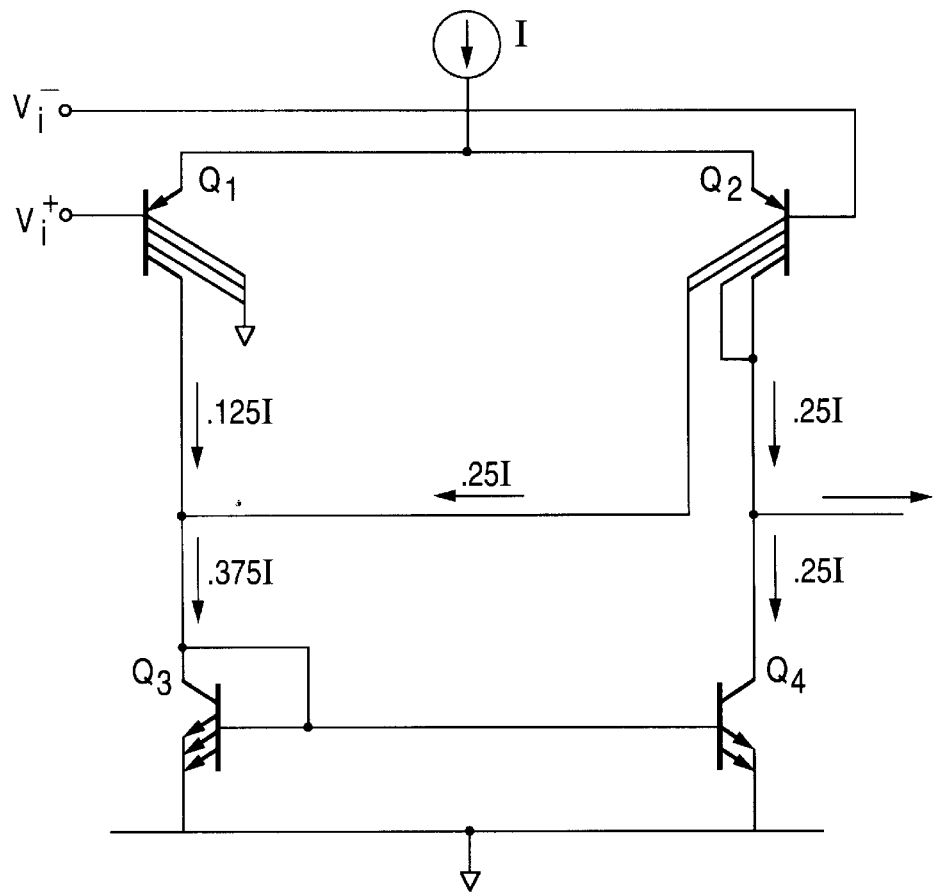
FIG. 10 is a schematic diagram illustrating an alternative embodiment of an input stage in accordance with the present invention.

FIG. 10 illustrates an embodiment of a differential stage in accordance with the invention in the balanced state, where Ie1=Ie2. In this state, I° equals zero, as shown, so that the systematic offset of this stage is 0 V.

Note that if the FIG. 10 circuit is now unbalanced, allowing Ie2=0, then Ic3=0.25 I and I°=−0.167 I. If, on the other hand, we allow Ie1=0, then I°=0.5 I−(0.5 I*⅔)=0.167 I.

Figure 11A:
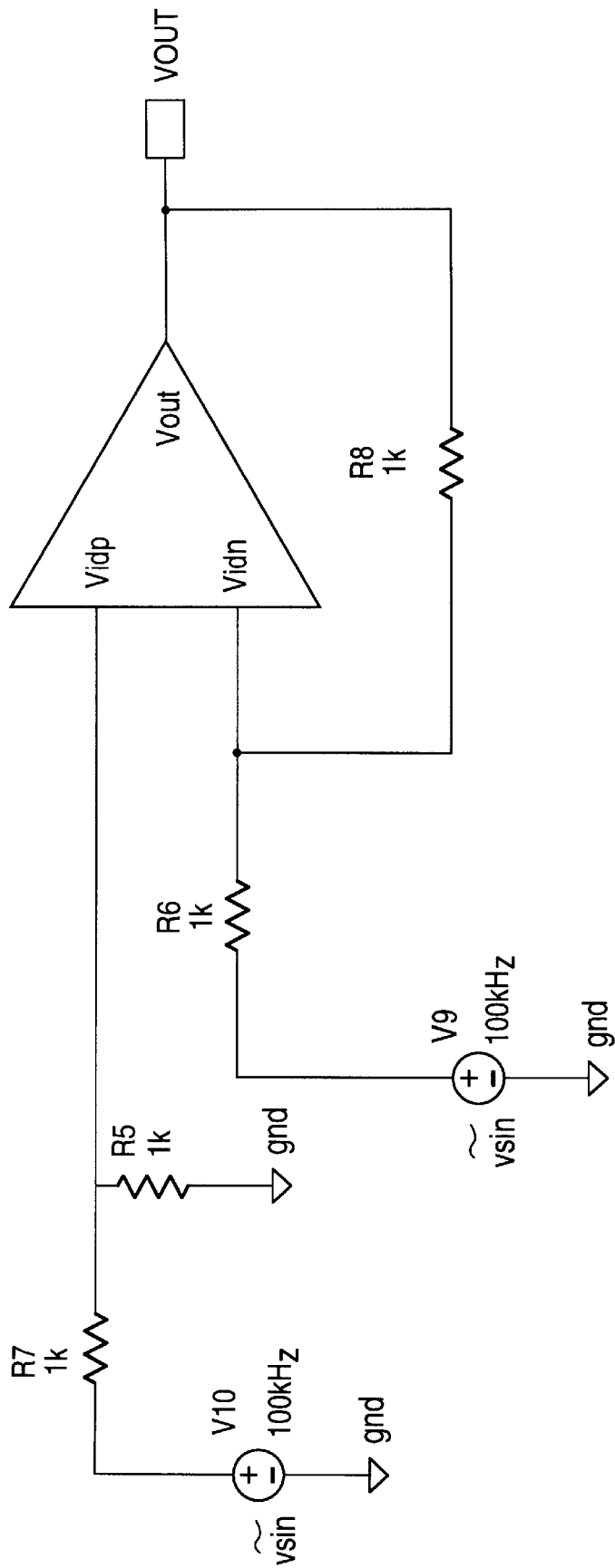
FIGS. 11A and 11B are, respectively, a schematic diagram of an idealized differencing amplifier which can be used for the purpose of demonstrating the principle of the invention and waveforms of the inputs and output of the amplifier of FIG. 11A demonstrating the principle of the invention, whereby a delayed signal subtracted from a reference signal results in a third signal with negative delay (phase lead).
Figure 11B:
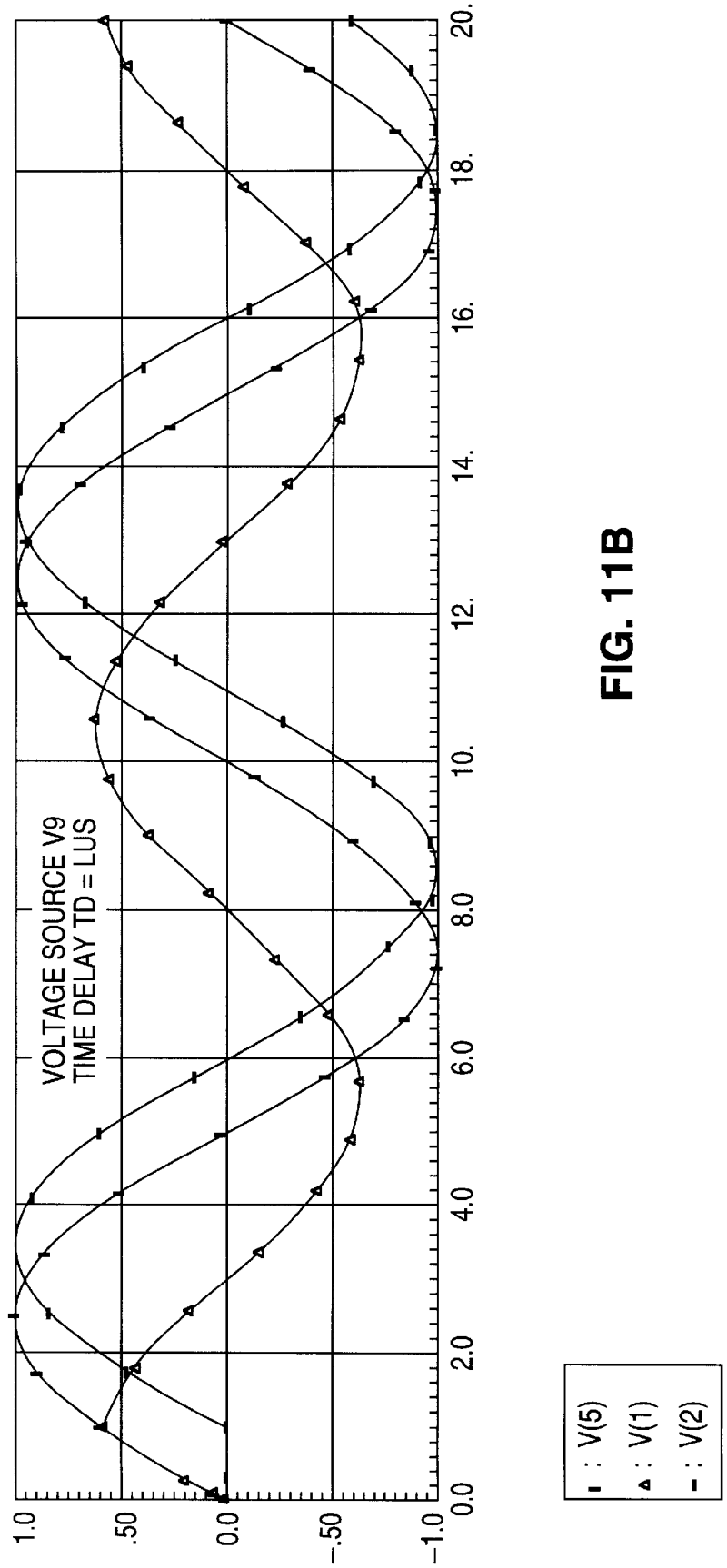

FIGS. 11A and 11B show a simple pictorial demonstration of phase lead obtained by subtracting a signal with a phase lag. FIG. 11A shows an ideal operational amplifier in a differencing configuration. The output VOUT of this amplifier is always the voltage difference between the positive and negative inputs. In the simulated waveforms shown in FIG. 11B, V(5) is the reference waveform from which waveform V(2) is subtracted to produce waveform V(1). Note that relative to V(5), V(2) has a phase lag and V(1), the resultant, has a phase lead.

Figure 12:
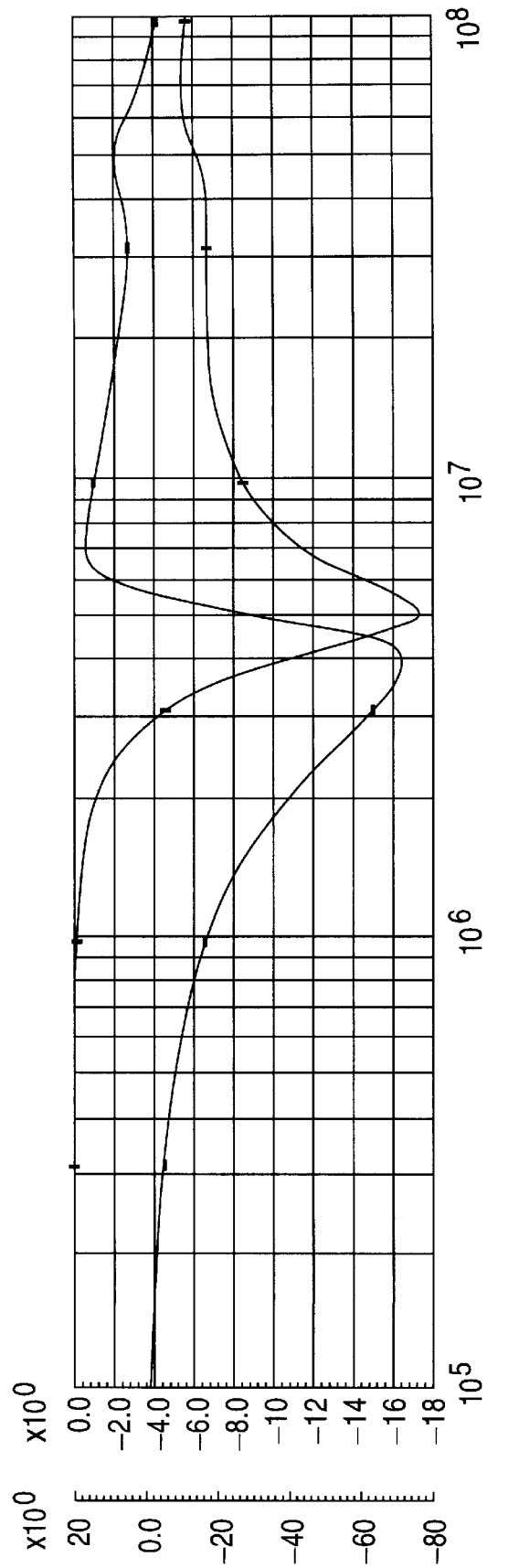
FIG. 12 is a DC plot of the input stage operating closed-loop.

FIG. 12 shows the AC plot of a differential stage in accordance with the invention operating closed-loop. Note that the phase angle never reaches −180°; rather, above the −3 dB frequency, the phase recovers and actually becomes positive, further verifying the principle of operation of the invention.

FIGS. 13A–13D provides a direct comparison of the invention with another popular Gm-reduction technique. Circuits 1 and 2 in FIGS. 13A and 13C, respectively, are configured to have nominal equal low-frequency transconductance and both use the same 15 pF compensation capacitor. Not only does the circuit of the present invention, i.e.,  circuit 1, have much greater phase margin (50° as opposed to 36°), but it also has slightly greater bandwidth. If the compensation capacitor of circuit 2 were increased sufficiently to provide a 50° phase margin, its bandwidth would be dramatically reduced. Thus, it can be seen that the present invention provides both better phase margin and greater bandwidth.

Figure 13:
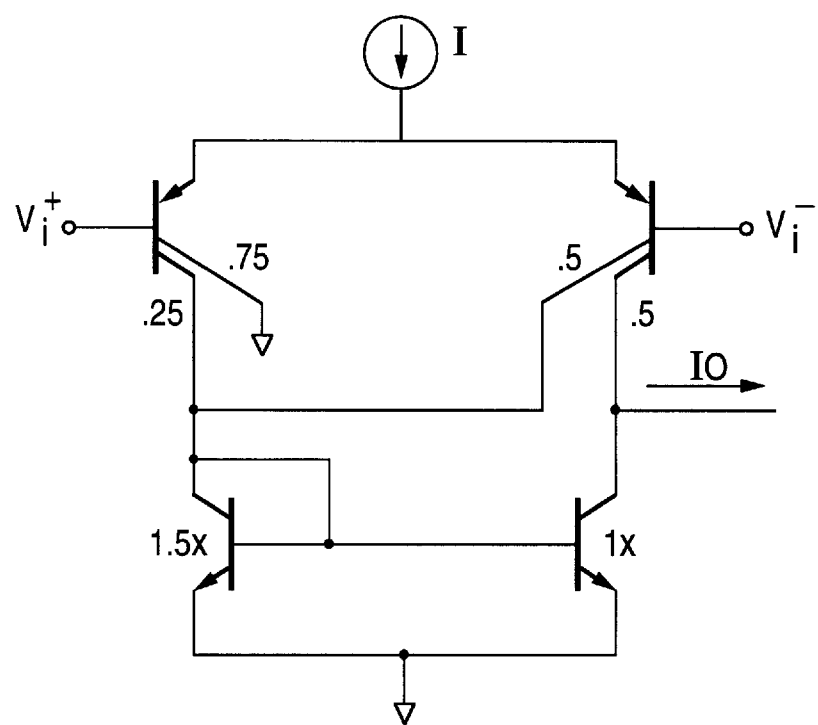
FIG. 13 is a shematic diagram illustrating an additional alternative embodiment of an input stage in accordance with the invention.

FIGS. 6, 7 and 13 illustrate three alternative embodiments of a differential stage in accordance with the invention. Note that all three circuits are in compliance with the two conditions discussed above with respect to FIG. 8.

It should be understood that various alternatives to the embodiments of the invention described herein may be employed in practicing the invention. It is intended that the following claims define the scope of the invention and that circuits and methods within the scope of these claims, and their equivalents, be covered thereby.

What is claimed is:

1. A differential stage circuit comprising:

a current source;

an output node;

a first pnp transistor having its base connected to receive a first input signal ($v_i^{30}$), its emitter connected to the current source, a first collector having area $$\frac{1}{B+1},$$

and a second collector connected to ground and having area $$\frac{B}{B+1};$$

a second pnp transistor having its base connected to receive a second input signal ($V_i^-$), its emitter connected to the current source, a first collector connected to the output node and having area $$\frac{1}{A+1},$$

and a second collector having area $$\frac{A}{A+1},$$

wherein the first collector of the first pnp transistor is connected to the second collector of the second pnp transistor;

a first npn transistor having its collector connected to the first collector of the first pnp transistor, its emitter connected to ground, and its base connected to its collector and having an emitter area Kx; and a second npn transistor having its collector connected to the output node, its emitter connected to ground, and its base connected to the base of the first npn transistor and having an emitter area 1x, and wherein the following conditions are met:

Condition 1: $AB > 1$

Condition 2: $\frac{1}{A+1} > \frac{1}{K}\left(\frac{A}{A+1} - \frac{1}{B+1}\right)$ $$\text{where } K = A + \frac{A+1}{B+1}$$

2. A differential stage circuit comprising:

a first current source generating current $I_1$;

a second current source generating current $K_2I_1$;

an output node;

a first pnp transistor having its base connected to receive a first input signal ($V_i^+$), its emitter connected to the first current source, and a collector connected to ground;

a second pnp transistor having its base connected to receive a second input signal ($V_i^-$), its emitter connected to the first current source, a first collector connected to the output node and having area $$\frac{1}{A+1},$$

and a second collector connected to the second current source and having area $$\frac{A}{A+1};$$

a first npn transistor having its collector connected to the second current source, its emitter connected to ground, and its base connected to its collector and having emitter area $K_1x$; and a second npn transistor having its collector connected to the output node, its emitter connected to ground, and its base connected to the base of the first npn transistor and having an emitter area 1x, and wherein the following conditions are met:

Condition 1: A>0

Condition 2: A<$K_1$ where $K_1$=A+2$K_2$(A+1).

* * * * *

UNITED STATES PATENT AND TRADEMARK OFFICE
CERTIFICATE OF CORRECTION

PATENT NO. : 5,880,636
DATED : March 9, 1999
INVENTOR(S) : Victor P. Schrader

It is certified that error appears in the above-identified patent and that said Letters Patent is hereby corrected as shown below:

In Col. 6, line 25, delete "$(V_i^{30})$" and replace with --$(V_i^+)$--.

In Col. 7, line 11, delete "$(V_i^{30})$" and replace with --$(V_i^+)$--.

Signed and Sealed this

Seventeenth Day of August, 1999

Attest:

Q. TODD DICKINSON

Attesting Officer

Acting Commissioner of Patents and Trademarks